United States Patent
Vo et al.

(10) Patent No.: US 7,105,383 B2
(45) Date of Patent: Sep. 12, 2006

(54) PACKAGED SEMICONDUCTOR WITH COATED LEADS AND METHOD THEREFORE

(75) Inventors: Nhat D. Vo, Austin, TX (US); Alan H. Woosley, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 200 days.

(21) Appl. No.: 10/230,743

(22) Filed: Aug. 29, 2002

(65) Prior Publication Data

US 2004/0041241 A1    Mar. 4, 2004

(51) Int. Cl.
*H01L 21/50* (2006.01)
(52) U.S. Cl. ............ 438/124; 438/125; 438/15
(58) Field of Classification Search ......... 257/787, 257/666, 667; 438/112, 123
See application file for complete search history.

(56) References Cited

U.S. PATENT DOCUMENTS

| | | | | |
|---|---|---|---|---|
| 4,743,956 | A | * | 5/1988 | Olla et al. .......... 257/674 |
| 5,447,267 | A | | 9/1995 | Sakai et al. |
| 5,837,558 | A | * | 11/1998 | Zuniga et al. ........ 438/15 |
| 5,905,299 | A | | 5/1999 | Lacap |
| 6,048,744 | A | * | 4/2000 | Corisis et al. ........ 438/15 |
| 6,194,777 | B1 | | 2/2001 | Abbott et al. |
| 6,753,922 | B1 | * | 6/2004 | Sengupta et al. ...... 348/374 |
| 2002/0127776 | A1 | * | 9/2002 | Nakajo et al. ........ 438/110 |
| 2003/0098440 | A1 | * | 5/2003 | Musa et al. .......... 252/182.13 |

FOREIGN PATENT DOCUMENTS

| | | |
|---|---|---|
| DE | 195 25 708 C1 | 1/1997 |
| JP | 56100459 | 8/1981 |
| JP | 61048953 | 3/1986 |
| JP | 63187656 | * 8/1988 |
| JP | SHO 62(1987)-187656 | 8/1988 |

OTHER PUBLICATIONS

Harper, Electronic Packaging Interconnection Handbook, 1991, McGraw-Hill, 8.1.*
Entek® Plus CU-106A—PWB Copper Protective Coating (Data Sheet); © 2000, Enthone-OMI, Inc.; Issued Aug. 3, 2000; 9 Pages.

* cited by examiner

*Primary Examiner*—Leonardo Andujar
(74) *Attorney, Agent, or Firm*—David G. Dolezal; Robert L. King

(57) ABSTRACT

A semiconductor die is housed in a package body. Leads, which are electrically coupled to the semiconductor die, extend from the package body and are for connecting to a printed circuit board or other device. The leads are coated with a material that protects the leads from oxidation. The coating is compatible with solder techniques that are commonly used to attach packaged semiconductors to a printed circuit board. In some examples, the coating is removable, after drying, at temperatures below one hundred eighty degrees Celsius. This allows for solder processes, which are typically at least 180° C., to remove the coating thereby exposing the leads, which has been protected from oxidation, so that it can be soldered to the printed circuit board. In some examples, the coating material includes an organic material. In some examples, the coating material is an organic solderability preservative (OSP).

17 Claims, 3 Drawing Sheets

US 7,105,383 B2

PACKAGED SEMICONDUCTOR WITH COATED LEADS AND METHOD THEREFORE

BACKGROUND OF THE INVENTION

1. Field of the Invention

This invention relates in general to a packaged semiconductor and specifically to a coating for the leads of the packaged semiconductor.

2. Description of the Related Art

Leaded packaged semiconductors typically include leads made of metal materials such as copper alloys or metal alloys. One problem with these packaged semiconductors is that the lead material may oxidize prior to a packaged semiconductor's attachment to a circuit board.

Prior methods for preventing oxidation have included coating the leads with metals such as, e.g., tin-lead, nickel-palladium, nickel-palladium gold, tin, and other tin alloys. Besides adding extra weight and expense, these metals may have a propensity to form "whiskers" after their application. Whiskers are spontaneously formed single crystal filaments of the coating material. These whiskers may cause shorts in circuits implementing the packaged semiconductor.

What is needed is a technique for reducing the problems of oxidation of the leads yet which does not produce the above identified problems associated with the conventional coatings.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
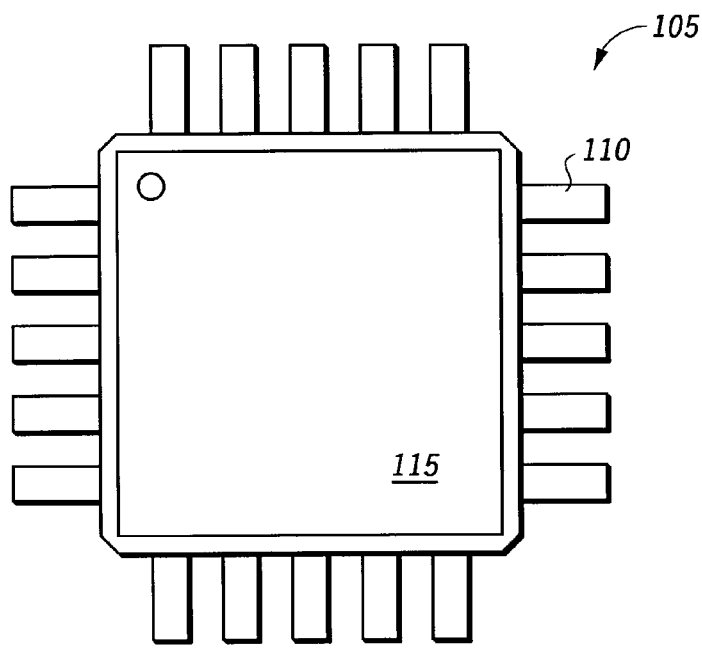
FIG. 1 is a top view of one embodiment of a packaged semiconductor according to the present invention.

FIG. 1 is a top view of one embodiment of a leaded packaged semiconductor according to the present invention. Packaged semiconductor 105 includes a semiconductor die (not shown in FIG. 1) encapsulated by a package body 115. Extending from the package body and electrically coupled to the die (not shown) are leads 110 for electrically coupling the semiconductor die to external devices (not shown). In one embodiment, leads 110 are made from a copper alloy. In other embodiment, leads 110 are made from alloy 42 (42% nickel with a remainder of iron).

Leads 110 are coated with a material to prevent the leads from oxidizing prior to the packaged semiconductor's attachment to a circuit board (not shown in FIG. 1) or other device. In some embodiments, the coating material includes an organic material. In some embodiments, the coating material is non conductive, while in other embodiments, the coating material is conductive. In some embodiments, the coating material is nonmetallic. However, in other embodiments, the coating material may include some metal material. In some embodiments, the coating is removable, after drying, from the leads at a temperature below 180 C. In some embodiments, the coating material is a liquid at room temperature. The coating material does not have the propensity to form whiskers. One example of a coating material is an organic solderability preservative (OSP). OSP material is conventionally applied to the surface of circuit boards during their manufacture to protect exposed solder pads of the circuit board prior to the attachment of electronic devices to the board. In one embodiment, the coating material is sold under the trade name of ENTEK PLUS CU-1106A TM by the ENTHONE Company owned by the COOKSON ELECTRONICS DIVISION of the COOKSON GROUP PLC of London England.

Figure 2:
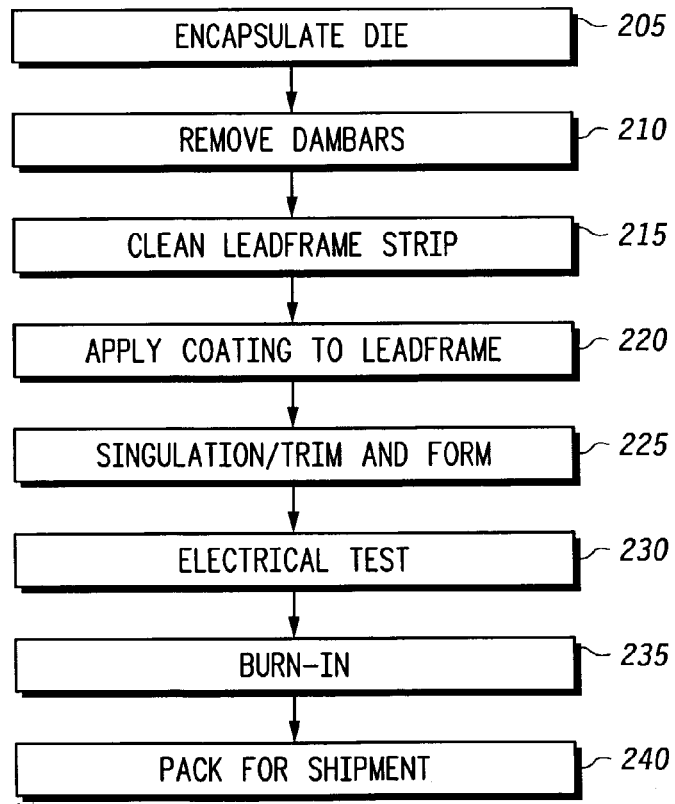
FIG. 2 is a flow chart of one embodiment of a portion of a method for manufacturing a packaged semiconductor according to the present invention.
Figure 3:
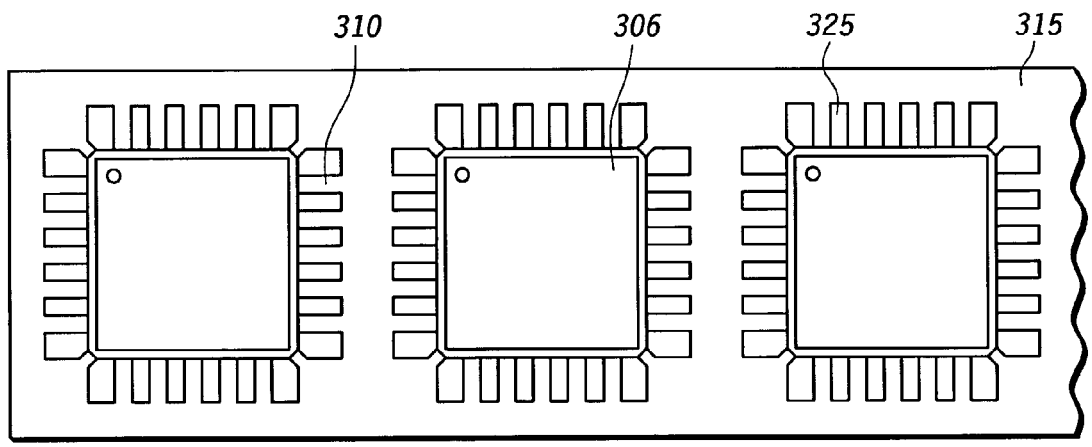
FIG. 3 is a top view of one embodiment of three packaged semiconductors during a stage of the manufacturing process.
Figure 4:
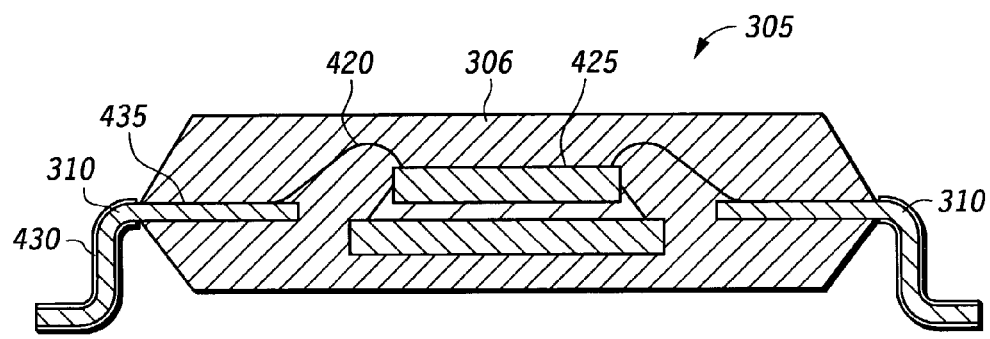
FIG. 4 is a cross sectional view of one embodiment of a packaged semiconductor according to the present invention.

FIG. 2 shows one embodiment of a portion of the manufacturing process of a packaged semiconductor. FIG. 3 shows a top view of three packaged semiconductors during a stage of the manufacturing process. FIG. 4 is a cross sectional view of a packaged semiconductor after the completion of the stages shown in FIG. 2.

Referring to FIG. 2, semiconductor dies (e.g., 425 in FIG. 4) located at die sites on a lead frame strip 315 (FIG. 3), are encapsulated by a package body (e.g., 306) in stage 205 of the manufacturing process. Referring to FIG. 4, the semiconductor dies (e.g., 425) are electrically coupled via wires (e.g., 420) and lead fingers (e.g., 435) to leads (e.g., 310) of the lead frame of a packaged semiconductor (e.g., 305).

After the removal of the dambars (not shown) from lead frame strip 315 (FIG. 3) in stage 210, the exposed portion of lead frame strip 315 (including the leads, e.g., 310) is cleaned in stage 215. In stage 220, a coating material (e.g., OSP) for preventing oxidation of the leads is applied to the exposed surfaces of lead frame strip 315 (including the leads, e.g., 310) to form a coating 430 (see FIG. 4) on the exposed surfaces. The coating material can be applied by conventional coating method such as e.g., by spraying or dipping. In stage 225, lead frame strip 315 is then trimmed to singulate the packaged semiconductors and to shape the leads (e.g., 310). Each packaged semiconductor is then electrically tested in stage 230 and then in stage 235, electrically stressed at high temperatures during the burn-in of the package. Afterwards the package is baked and dried in stage 240 where it is ready for shipment as shown in FIG. 4.

Figure 5:
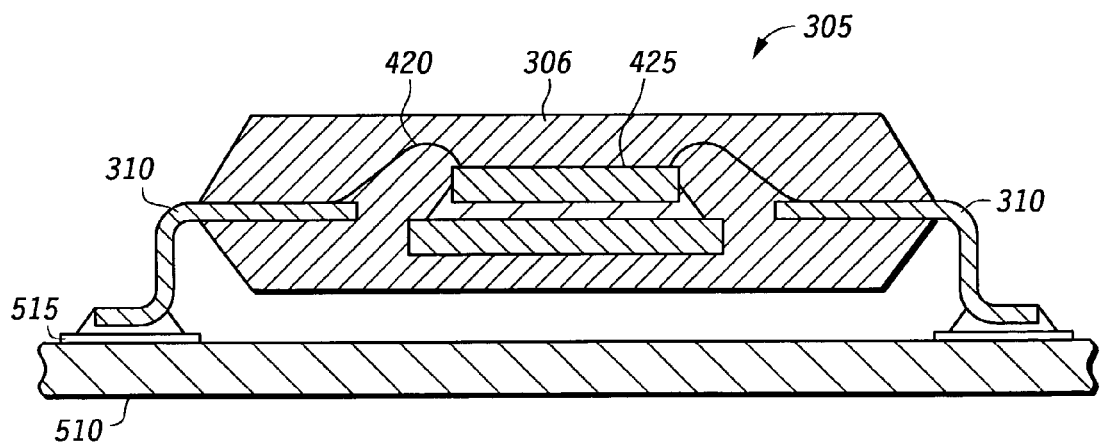
FIG. 5 is a cross sectional view of one embodiment of a packaged semiconductor attached to a circuit board according to the present invention.

FIG. 5 is a cross sectional view showing packaged semiconductor 305 attached to a circuit board 510. During the attachment, the leads (e.g., 310) of the packaged semiconductor 305 are soldered to pads (e.g., 515) located on the surface of circuit board 510. The coating material of coating 430 (see FIG. 4) is compatible with the solder process such that a lead (e.g., 310) coated with the coating material can be soldered to another structure without interfering with the soldering process. Because the coating material of coating 430 is removable, during the soldering process, the heat applied to the leads (e.g., 310) removes the substantial majority of coating 430 from the leads (e.g., 310). In one embodiment, the coating material of coating 430 is removable, after drying, at temperature less than 180 C (as well as temperatures equal to and above 180 C). Because the coating material in these embodiments is removable, after drying, at temperatures below 180 C, almost all of coating 430 can be removed with the heat generated by the soldering process. However, the coating may be removed by subjecting the coated leads to temperatures above 180 C as well. In other embodiments, the material used for coating is selected based on its removablity at temperatures required for the soldering reflow process.

Figure 6:
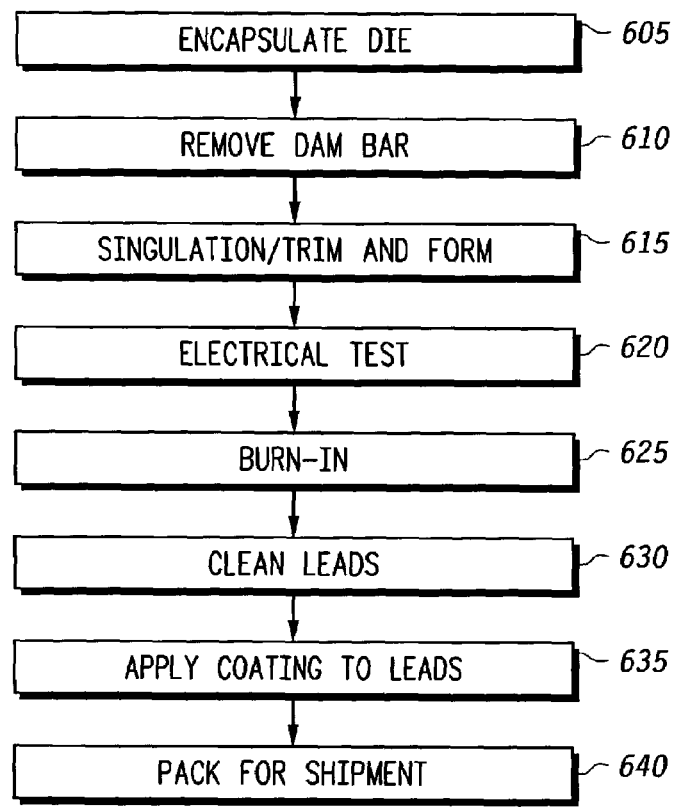
FIG. 6 is a flow chart of another embodiment of a portion of a method for manufacturing a packaged semiconductor according to the present invention.
Figure 7:
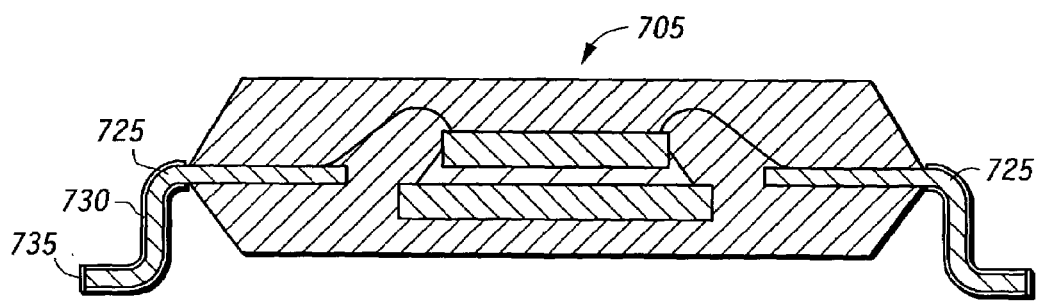
FIG. 7 is a cross sectional view of another embodiment of a packaged semiconductor according to the present invention.

FIG. 6 shows a portion of another process for manufacturing a packaged semiconductor. FIG. 7 shows a cross sectional view of a packaged semiconductor manufactured according to the process of FIG. 6. In the process of FIG. 6, a coating (e.g., 730 on FIG. 7) is applied to the leads (e.g., 725) after the electrical test stage 620 and burn-in 625 stage. Prior to the application of the coating (e.g., 730) in stage 635, the leads are cleaned in stage 630. After the coating stage 635, the packaged semiconductor (e.g., 705) is prepared for shipment in stage 640. One difference between the process of FIG. 2 and the process of FIG. 6 is that with the process of FIG. 6, the end tips (e.g., 735 on FIG. 7) of the leads are also coated. One advantage of applying the coating after the electrical testing 620 and burn-in 625 stages is that the coating will not interfere with these stages or contaminate the equipment that performs these stages.

Those of skill in the art will appreciate that, based upon the teachings herein, the coating material can be applied to the leads at different stages in the manufacturing process. For example, referring to FIG. 6, the cleaning stage 630 and coating stage 635 may be performed after the singulation stage 615 and before the electrical test stage 620. Performing the application of the coating just after the singulation stage may help prevent oxidation from occurring during testing stage 620 and burn-in stage 625 and may also aid in the manufacture process. In another embodiment, the coating may be applied to the lead frame strip 315 (see FIG. 3) prior to the coupling of the dies to the lead frame strip.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of making a packaged semiconductor, comprising:
    encapsulating a semiconductor die together with a portion of a lead frame;
    coating at least leads of the lead frame with a coating that, after drying, is removable from the leads by applying heat at a temperature below one hundred eighty degrees Celsius, wherein the coating includes an organic material; and
    electrically testing the semiconductor die;
    wherein the coating occurs before the electrical testing;
    wherein the leads are formed from a metal material;
    in the leads includes coating the leads with no metal material coating located between the coating and the metal material of the leads.

2. The method of claim 1, wherein the coating comprises dipping the leads in a coating material that, after drying, is removable at temperatures below one hundred eighty degrees.

3. The method of claim 1, wherein the coating comprises spraying the leads with a coating material that, after drying, is removable at temperatures below one hundred eighty degrees.

4. The method of claim 1, further comprising:
    attaching the packaged semiconductor to a circuit board, the attaching further includes:
        soldering the leads to solderable surfaces of the circuit board by applying heat above one hundred eighty degrees Celsius.

5. The method of claim 1, Further comprising cleaning the leads prior to the coating.

6. The method of claim 1 wherein the lead frame is a portion of a lead frame strip, the lead frame strip including a plurality of die sites, the method further comprising:
    singulating the die sites, wherein the coating is performed after the singulating and before the testing.

7. The method of claim 1 wherein the coating includes an organic solderabiliity preservative (OSP).

8. The method of claim 1 wherein the metal material of the leads includes at least one of copper and alloy 42.

9. A method of making a packaged semiconductor, comprising:
    encapsulating a semiconductor die together with a portion of a lead frame;
    coating at least leads of the lead frame with a coating that, after drying, is removable from the leads by applying heat at a temperature below one hundred eighty degrees Celsius;
    electrically testing the semiconductor die;
    wherein the coating is performed prior to the encapsulating;
    wherein the coating includes an organic material;
    wherein the leads are formed from a metal material;
    wherein the coating the leads includes coating the leads with no metal material coating located between the coating and the metal material of the leads.

10. The method of claim 9, wherein the coating occurs after the electrical testing.

11. The method of claim 9, wherein the coating occurs before the electrical testing.

12. A method of making a packaged semiconductor, comprising:
    encapsulating a semiconductor die together with a portion of a lead frame;
    coating at least leads of the lead frame with a coating that, after drying, is removable from the leads at a temperature below one hundred eighty degrees Celsius; and
    electrically testing the semiconductor die;
    wherein the lead frame is a portion of a lead frame strip, the lead frame strip including a plurality of die sites, the method further comprising:
        singulating the die sites, wherein the coating is performed before the singulating.

13. The method of claim 12 wherein:
    the coating includes an organic material;
    the leads are formed From a metal material;
    the coating the leads includes coating the leads with no metal material coating located between the coating and the metal material of the leads.

14. The method of claim 12 wherein:
    the coating includes an organic material;
    the leads are Loaned from a metal material;

the coating the leads includes coating the leads with no metal material coating located between the coating and the metal material of the leads.

15. A method of making a packaged semiconductor, comprising:

encapsulating a semiconductor die together with a portion of a lead frame;

coating at least loads of the lead frame with a coating that, after drying, is removable from the leads by applying heat at a temperature below one hundred eighty degrees Celsius, wherein the coating includes an organic material; and wherein the leads are formed from a metal material; wherein the coating the leads includes coating the leads with no metal material coating located between the coating and the metal material of the leads.

16. The method of claim 15 wherein the lead frame is a portion of a lead frame strip, the lead frame strip including a plurality of die sites, the method further comprising:

singulating the die sites, wherein the coating is performed after the singulating.

17. The method of claim 15 wherein the metal material of the leads includes at least one of copper and alloy 42.

* * * * *

UNITED STATES PATENT AND TRADEMARK OFFICE
CERTIFICATE OF CORRECTION

PATENT NO. : 7,105,383 B2 Page 1 of 1
APPLICATION NO. : 10/230743
DATED : September 12, 2006
INVENTOR(S) : Nhat D. Vo et al.

It is certified that error appears in the above-identified patent and that said Letters Patent is hereby corrected as shown below:

In Column 3, Line 65, Claim No. 1:

Change "in" to --wherein the coating--.

In Column 4, Line 67, Claim No. 14:

Change "Loaned" to --formed --.

In Column 5, Line 8, Claim No. 15:

Change "loads' to --leads--.

Signed and Sealed this

Thirtieth Day of October, 2007

JON W. DUDAS
*Director of the United States Patent and Trademark Office*